(12) United States Patent
Murphy et al.

(10) Patent No.: US 10,218,322 B2
(45) Date of Patent: Feb. 26, 2019

(54) TRANSCONDUCTANCE CURRENT SOURCE

(71) Applicant: FIRECOMMS LIMITED, Cork (IE)

(72) Inventors: Patrick Murphy, Cork (IE); Colm Donovan, Leap (IE); Ciaran Cahill, Blarney (IE)

(73) Assignee: Firecomms Limited, Cork (IE)

( * ) Notice: Subject to any disclaimer, the term of this patent is extended or adjusted under 35 U.S.C. 154(b) by 0 days.

(21) Appl. No.: 15/759,404

(22) PCT Filed: Sep. 13, 2016

(86) PCT No.: PCT/EP2016/071529
§ 371 (c)(1),
(2) Date: Mar. 12, 2018

(87) PCT Pub. No.: WO2017/046069
PCT Pub. Date: Mar. 23, 2017

(65) Prior Publication Data
US 2018/0212575 A1   Jul. 26, 2018

(30) Foreign Application Priority Data
Sep. 15, 2015   (EP) .................................... 15185219

(51) Int. Cl.
*H04B 1/38*   (2015.01)
*H03F 3/345*   (2006.01)
(Continued)

(52) U.S. Cl.
CPC ............. *H03F 3/345* (2013.01); *H03F 1/223* (2013.01); *H03F 1/3205* (2013.01); *H03F 3/082* (2013.01);
(Continued)

(58) Field of Classification Search
CPC ....................................................... H04B 1/38
(Continued)

(56) References Cited

U.S. PATENT DOCUMENTS 5,412,309 A    5/1995   Ueunten
5,463,348 A   10/1995   Sarpeshkar et al.
(Continued)

FOREIGN PATENT DOCUMENTS

CN    102664597 A    9/2012

OTHER PUBLICATIONS

International Search Report issued in PCT/EP2016/071529; dated Nov. 21, 2016.
(Continued)

*Primary Examiner* — Henry Choe
(74) *Attorney, Agent, or Firm* — Studebaker & Brackett PC

(57) ABSTRACT

A transconductance circuit has an input terminal ($V_{IN}$) and an output terminal (Out), a first current source (4) having a gate connected to said input terminal ($V_{IN}$); and a second current source (5), in parallel with said first current source, and having a higher transconductance and a wider dynamic range than the first current source. The current sources are configured so that at a low input voltage only the first current source (4) is on. A voltage drop circuit provides a lower bias voltage for the second current source than for the first current source.

5 Claims, 4 Drawing Sheets

Circuit diagram of a transconductance circuit of the invention.

(51) Int. Cl.
*H03F 1/22* (2006.01)
*H03F 1/32* (2006.01)
*H03F 3/08* (2006.01)
*H03F 3/50* (2006.01)

(52) U.S. Cl.
CPC ....... *H03F 3/505* (2013.01); *H03F 2200/456* (2013.01); *H03F 2203/5031* (2013.01)

(58) Field of Classification Search
USPC .......................................................... 330/136
See application file for complete search history.

(56) References Cited

U.S. PATENT DOCUMENTS

| | | | | |
|---|---|---|---|---|
| 5,469,104 | A | * | 11/1995 | Smith ....................... H03F 1/22 327/482 |
| 5,886,578 | A | * | 3/1999 | Miyashita ........... H03F 3/45076 330/253 |
| 7,020,485 | B2 | * | 3/2006 | Dathe ..................... G05F 3/242 327/359 |
| 2002/0089377 | A1 | | 7/2002 | Hwang |
| 2011/0298541 | A1 | | 12/2011 | Shi |
| 2011/0316632 | A1 | | 12/2011 | Takemoto et al. |

OTHER PUBLICATIONS

A. K. Gupta et al.; "A Wide Dynamic Range Continuously Adjustable CMOS Current Mirror"; IEEE Journal of Solid-State Circuits; Aug. 1996; pp. 1208-1213; vol. 31, No. 8.

Alçi Zekçi et al.; "Accurate active-feedback CMOS cascode current mirror with improved output swing"; Int. J. Electronics; 1998; pp. 335-343; vol. 84, No. 4.

Teresa Serrano-Gotarredona et al.; "Very Wide Range Tunable CMOS/Bipolar Current Mirrors with Voltage Clamped Input"; IEEE Transactions on Circuits and Systems—I: Fundamental Theory and Applications; Nov. 1999; pp. 1398-1407; vol. 46, No. 11.

* cited by examiner

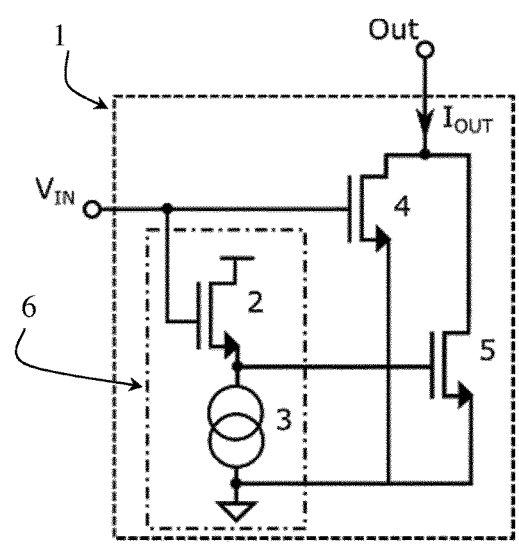
Fig. 1. Circuit diagram of a transconductance circuit of the invention.

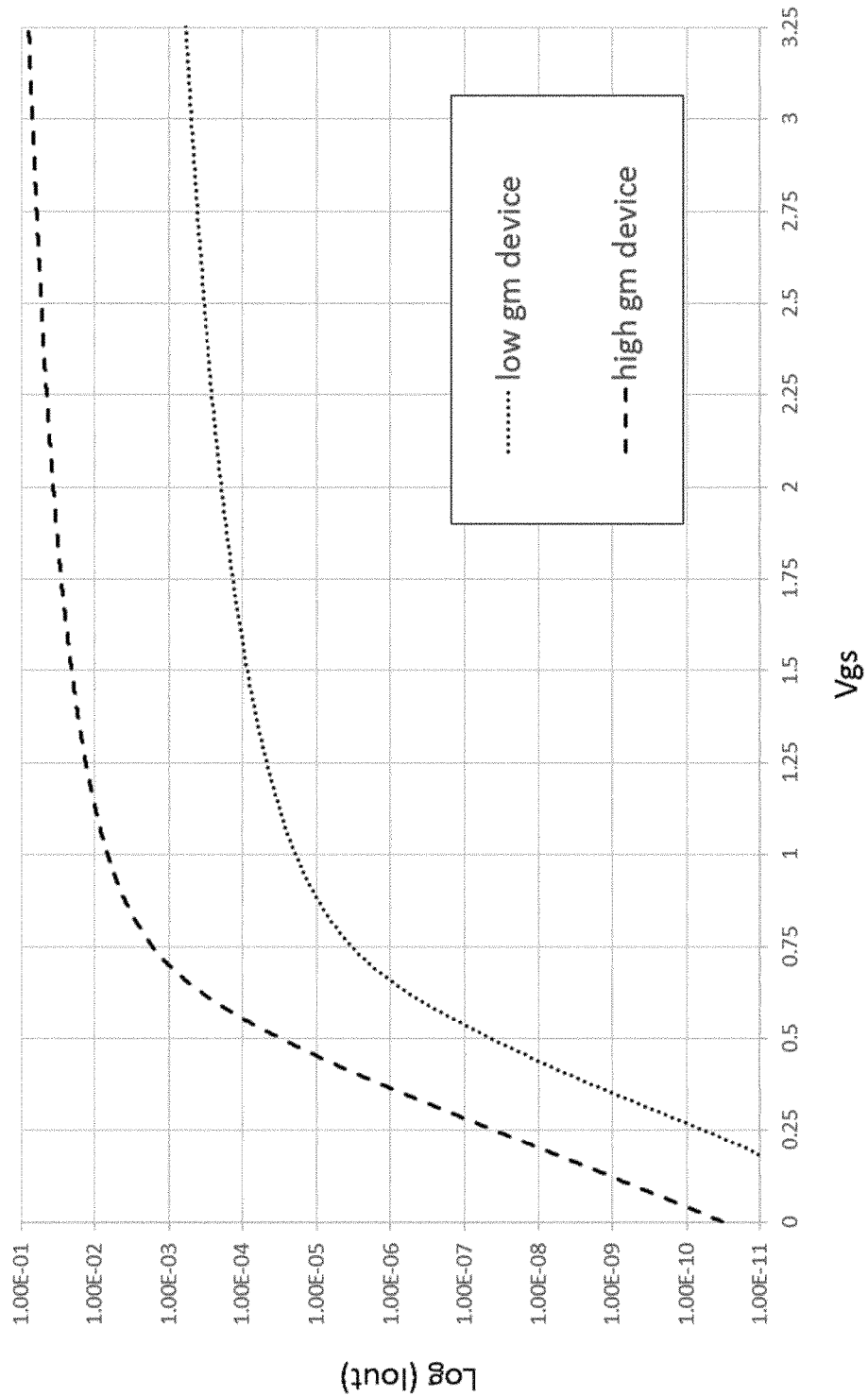
Fig. 2. Output current vs. gate source voltage for the two different sized MOSFET devices, with a fixed Vds.

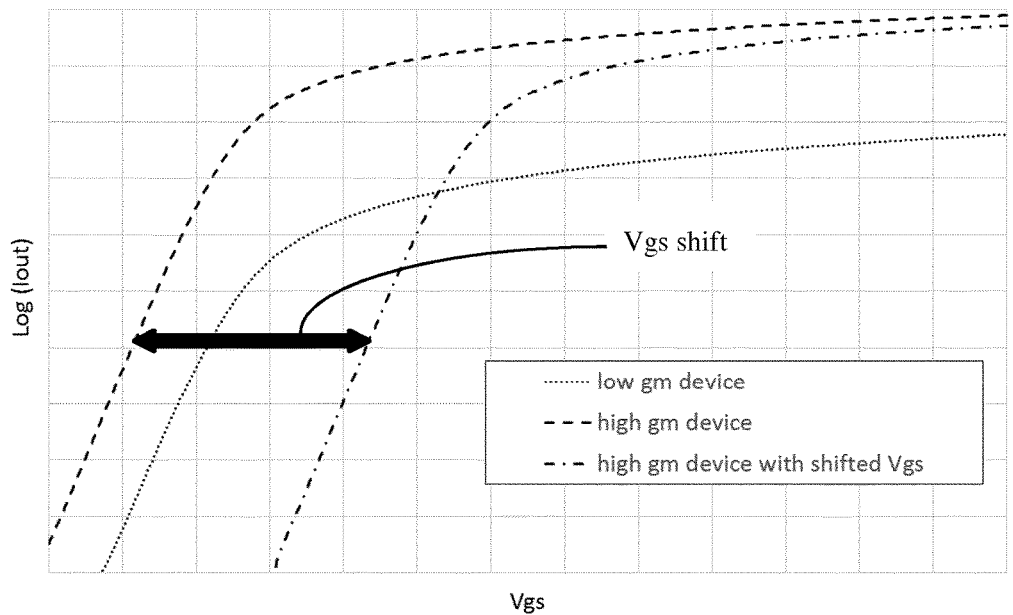
Fig. 3. Output current vs. gate source voltage for the two different sized MOSFET device and a Vgs shifted MOSFET device, with a fixed Vds.
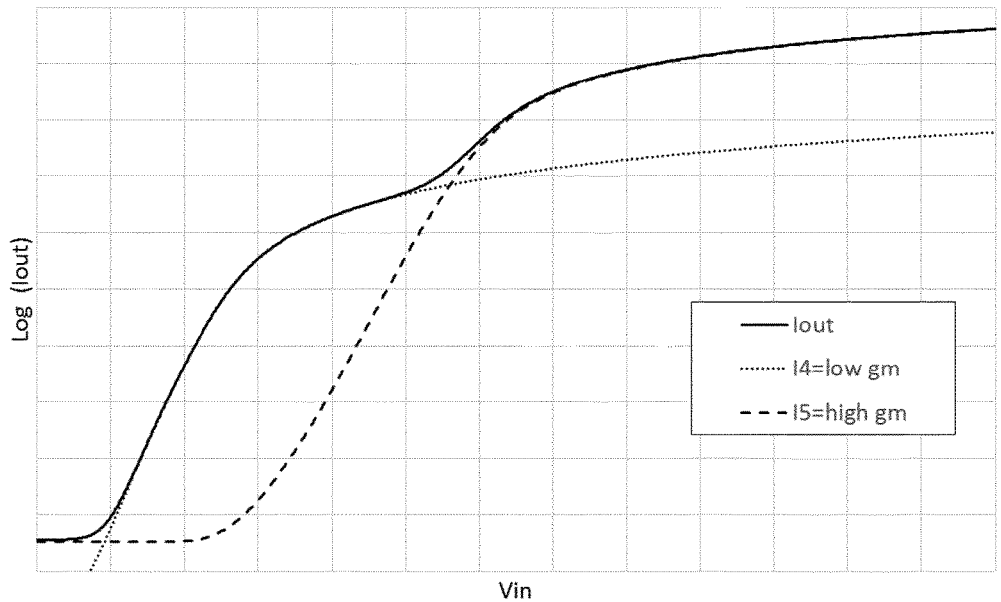
Fig. 4. Output current vs. input voltage for the transconductance circuit, with a fixed Vds.
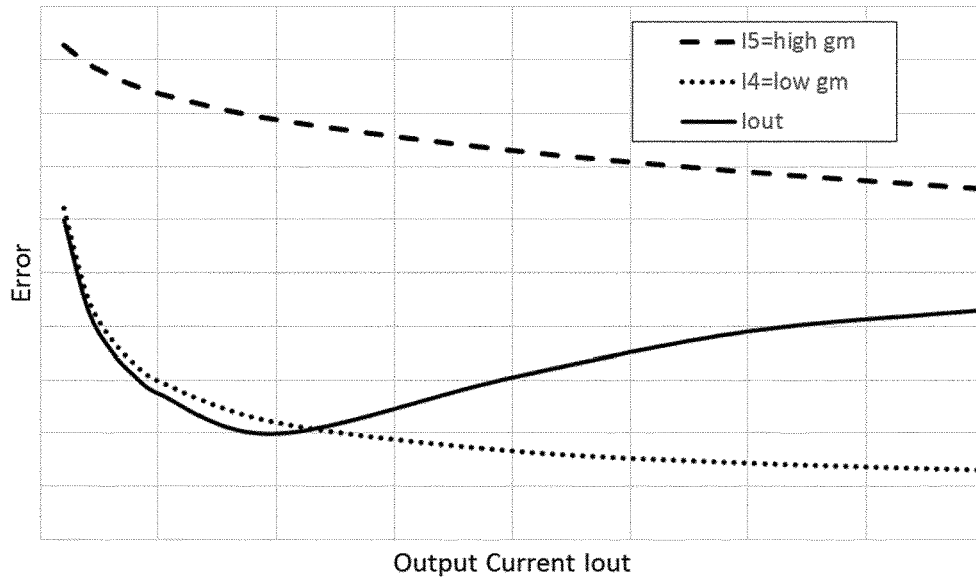
Fig. 5. Comparison of mismatch error vs. output current
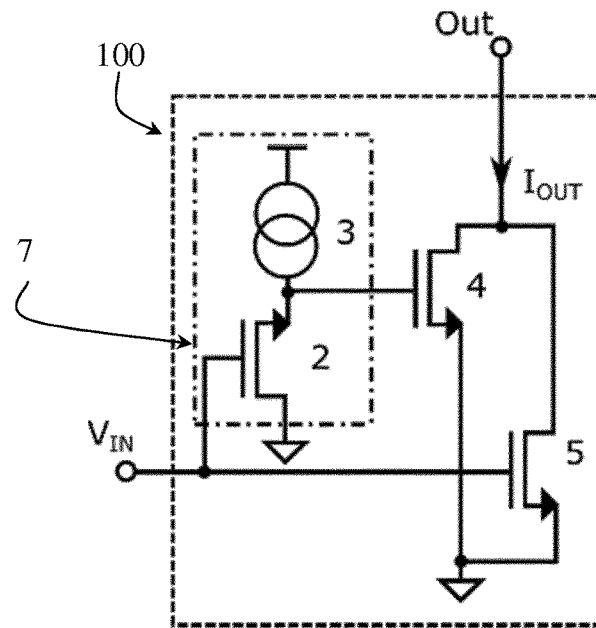
Fig. 6. Diagram of an alternative transconductance circuit of the invention.

TRANSCONDUCTANCE CURRENT SOURCE

FIELD OF THE INVENTION

The invention relates to a transconductance current source.

Transconductance ($g_m$) is the ratio of the change in current at the output terminal to the change in the voltage at the input terminal of an active device:

$$g_m = \frac{\Delta Iout}{\Delta Vgs}$$

where $I_{out}$ is the output current of the device, and $V_{gs}$ is the gate source voltage.

This invention is directed towards providing a circuit that improves the dynamic range, accuracy and tolerance to mismatch of a transconductance current source circuit over a single current source device.

PRIOR ART DISCUSSION

In many applications where two transconductance current sources are driven by the same voltage, the relative accuracy between the two outputs is important. Accuracy can be achieved by (a) having large area devices or (b) having low $g_m$ current sources, so any $V_{th}$ mismatch in the MOSFETs will have limited effect on the difference in current between the two outputs. Secondly it is beneficial to have low $g_m$ devices if the accuracy for small output current changes is important.

Where a wide range of output current is required, a high $g_m$ current source will provide the current, for a limited input voltage ($V_{IN}$).

U.S. Pat. No. 5,463,348 describes transconductance amplifiers with a wide input linear range.

CN102664597 describes a wide adjustment range transconductance amplifier.

U.S. Pat. No. 5,412,309 describes current amplifiers.

LITERATURE REFERENCES

[1] A Wide Dynamic Range Continuously Adjustable CMOS Current Mirror, A. K. Gupta, J. W. Haslett, and F. N. Trofimenkoff, IEEE JOURNAL OF SOLID-STATE CIRCUITS, VOL. 31, NO. 8, AUGUST 1996
[2] Accurate active-feedback CMOS cascode current mirror with improved output swing ALÇI ZEKÇI[2] and HAKAN KUNTMAN, INT. J. ELECTRONICS, 1998, VOL. 84, NO. 4, 335-343
[3] Very Wide Range Tunable CMOS/Bipolar Current Mirrors with Voltage Clamped Input, Teresa Serrano-Gotarredona, Bernab'e Linares-Barranco,and Andreas G. Andreou, IEEE TRANSACTIONS ON CIRCUITS AND SYSTEMS—I: FUNDAMENTAL THEORY AND APPLICATIONS, VOL. 46, NO. 11, NOVEMBER 1999

SUMMARY OF THE INVENTION

We describe a transconductance circuit comprising an input terminal ($V_{IN}$) and an output terminal (Out); a first current source having a gate connected to said input terminal ($V_{IN}$); and a second current source, in parallel with said first current source, and having a higher transconductance and a wider dynamic range than the first current source, and wherein the current sources are configured so that at a low input voltage only the first current source is on.

Preferably, the transconductance circuit comprises a voltage drop circuit providing a lower bias voltage for the second current source than for the first current source.

Preferably, the voltage drop circuit comprises a source follower and a current source for the source follower, in which the input terminal is linked with the gate of the source follower and the first current source.

Preferably, the source follower and the current sources are configured so that a gate-source voltage drop across the source follower ensures that the second current source is off until a point during which the input voltage increases at which the second current source is switched on.

Preferably, each of the current sources is a NMOS or a PMOS MOSFET device or a PNP or an NPN transistor.

Preferably, the circuit comprises greater than two current sources with different transconductances which are connected in parallel.

Preferably, an output terminal is linked either directly or via cascodes to the outputs of the first and second current sources.

We also describe an optical receiver comprising a photodiode and a transconductance circuit of any embodiment linked to said photodiode.

Additional Statements

According to the invention, there is provided a transconductance circuit comprising:
  a first current source with low transconductance and good accuracy for low output currents; and
  a second current source with a high transconductance and a wide dynamic range.

In one embodiment, the circuit comprises a source follower and a current source for the source follower, in which the input is linked with the gate of the source follower and the first current source.

In one embodiment, the current sources are configured so that at low input voltage only the low first current source 4 is on.

In one embodiment, the source follower and the current sources are configured so that a gate-source voltage drop across the source follower ensures that the second current source is off until a point during which the input voltage increases at which the second current source is switched on.

In one embodiment, the sizing of the first and second current sources dictates the accuracy at lower voltage and range at the high voltage, and helps to linearize the output current over the input voltage range.

In one embodiment, each of the current sources is a NMOS or a PMOS MOSFET device or a PNP or an NPN transistor.

In one embodiment, a plurality of devices with low to high transconductances are connected in parallel.

DETAILED DESCRIPTION OF THE INVENTION

Brief Description of the Drawings

The invention will be more clearly understood from the following description of some embodiments thereof, given by way of example only with reference to the accompanying drawings in which:

FIG. 1 is a circuit diagram of a transconductance circuit of the invention;

FIG. 2 is a plot of Log of the output current versus gate-source voltage for the two different size MOSFET devices of current sources of the circuit, with a fixed Vds;

FIG. 3 is a plot of Log of output current versus gate source voltage for the two different sized MOSFET device and a Vgs shifted MOSFET device, with a fixed Vds;

FIG. 4 is a plot of Log of the output current versus input voltage for the circuit of FIG. 1, with a fixed Vds;

FIG. 5 is a plot of nominal error in current (due to device mismatch) versus output current for single low $g_m$ and high $g_m$ devices of the circuit; and FIG. 6 is a diagram of an alternative transconductance circuit of the invention.

DESCRIPTION OF THE EMBODIMENTS

In transconductance circuits a low $g_m$ current mirror will output a low current across its Vgs range (small dynamic range) but will have good accuracy and a high tolerance to mismatch. A high $g_m$ current mirror of a similar area will output a large current across its Vgs range (high dynamic range) but will have poor accuracy and a low tolerance to mismatch for small Iout. Referring to FIG. 1 a transconductance circuit 1 comprises a low $g_m$ current source 4, and a high $g_m$ current source 5 connected in parallel. There is a voltage drop circuit 6, in this comprising a source follower 2 and a current source 3 for the source follower. The bias gate of the (low $g_m$) current source 4 is connected to the overall input terminal $V_{IN}$. The source follower 2 also has a bias gate linked to $V_{IN}$, and the current source 3 is linked to the output of the source follower 2. The output of the source follower 2 is also connected to the bias gate of the second (high $g_m$) current source 5. The circuit 1 has a single output, Out, from the first (low $g_m$) current source 4, and second (high $g_m$) current source 5, connected in parallel.

The transconductance circuit of the invention may advantageously be employed in any of a range of applications, such as optical receivers, for converting a photodiode current signal to an output signal for downstream processing.

For the examples given here the width/length of the sources 4 and 5 are 4 μm/4 μm, and 80 μm/0.35 μm. The approximate $g_m$ values of the sources 4 and 5 are 50 μS (micro Siemens) and 15000 μS for a Vgs voltage of 0.8 Volts.

The voltage drop circuit 6 may be implemented as a "voltage change" circuit, as the voltage differential across it may be required to change in a predetermined manner This may involve a linear circuit where the voltage change is implemented by a combination of a resistor with a current source/sink, with the use of an amplifier to buffer the input from any current dissipation, or the use of a non-linear circuit to achieve the required predefined dynamic change.

FIG. 2 shows the output current versus gate source voltage for the two (different sized) MOSFET devices 4 and 5. This is a plot of the output current versus Vgs for two unconnected single current mirrors, one with a low $g_m$ and the other with a high $g_m$. It can be seen that the high $g_m$ device outputs a significantly higher current across the full Vgs range, but saturates at a lower Vgs point. The accuracy of the high $g_m$ device is poor because for a small change in Vgs there is a large change in output current. But with a low $g_m$ device the accuracy is better because for a small change in Vgs there is a smaller change in output current.

FIGS. 2 to 4 are plotted versus voltage, whose approximate volts per division is 250 mV. Current is plotted on the Y-axis in log format, with a decade increase in each division. In each of these plots the output current of the currents sources is for operation with a fixed drain voltage.

FIG. 3 is the same as FIG. 2 but includes a high $g_m$ device which is operating with a shifted Vgs, so it only turns on at high $V_{IN}$. Referring to FIG. 4, this shows combining of the two current mirrors in one circuit. Using a low $g_m$ and Vgs shifted high $g_m$ current mirror connected in parallel that creates an output current that improves the dynamic range, accuracy and tolerance to mismatch of a single transconductance current source circuit.

FIG. 5 shows a plot of the possible output current error due to mismatch of identical devices, for three cases versus the output current. The three cases being (1) a low $g_m$ current mirror, (2) a high $g_m$ current mirror and (3) the circuit of the invention. The plot shows that the circuit of the invention combines the advantages of the individual low $g_m$ current mirror and high $g_m$ current mirror—low error due to mismatch and a large dynamic range. It is clear that the low $g_m$ device will be accurate for small changes in $V_{IN}$ and tolerant to mismatch, whereas the high $g_m$ has the advantage of covering a wide current range.

The transconductance circuit 1 improves the dynamic range of a single current source, as illustrated in FIGS. 3 and 4, to improve the accuracy at low output currents, as illustrated in FIG. 5, and ensure it has the dynamic range to output higher currents if required.

The manner in which the two current sources 4 and 5 are connected to the inputs by the components 2 and 3 is advantageous because it combines the advantages of both a low $g_m$ current source 4, and a high $g_m$ current source 5 in one circuit. At low $V_{IN}$ only the low $g_m$ device 4 is on, as the gate source voltage drop across the source follower (2) ensures that the high $g_m$ device (5) is off. As the $V_{IN}$ increases the high $g_m$ device 5 is switched on. The sizing of the low $g_m$ and high $g_m$ devices 4 and 5 dictate the accuracy at lower voltage and range at the high voltage, and helps to linearize the output current over the $V_{IN}$ range.

In more detail, FIG. 2 shows a comparison between the output current vs. gate source voltage (Vgs) for the low $g_m$ and high $g_m$ MOSFET devices 4 and 5. The low $g_m$ device can output current from very low values to a nominal maximum value whereas the high $g_m$ device can have output a current range up to 100 times the low $g_m$ device over the same Vgs range depending on the size difference.

FIG. 6 shows an example of another embodiment, in which in a circuit 100 the input is connected to the high $g_m$ current mirror and a voltage increase circuit can create a voltage higher than the input for the low $g_m$ current mirror. The operation is the same, as $V_{IN}$ increases the low $g_m$ current mirror turns on before the high $g_m$ current mirror. The benefit of this arrangement is that the circuit operates in a similar manner for a lower input voltage range, which adds flexibility to the use of this circuit.

In various embodiments, a transconductance circuit of the invention has at least two current sources. One source is a single current source, which is sized to have low transconductance and to have good accuracy for low output currents, but would have a poor dynamic range. The other is a single current source, which is sized to have high $g_m$ and a wide dynamic range but poor accuracy for low output current. The transconductance circuit 1 combines both of these current sources into one circuit to achieve high accuracy for low output current, a wide dynamic range for high current, and improved the linearity across the range of output currents.

It will be appreciated that the transconductance circuit improves the dynamic range (due to the high $g_m$ current device), accuracy and tolerance to mismatch of the output current versus a single transconductance current source (due to the low $g_m$ current device). The linearity of the transconductance is improved versus a single device as shown in FIG. 4.

It is known in the art that the mismatch of a single high $g_m$ device can be improved by increasing the area by a large multiple, to achieve the same mismatch error as a single low $g_m$ device. This generates a single large device, with good dynamic range, good tolerance to mismatch, but has the disadvantages of low speed due to the large capacitance which results from large area. A second disadvantage with such a single large area high $g_m$ device is that it would have poor output current accuracy at low Vgs, because the $g_m$ of this single device still needs to be high to cover the required dynamic range. The invention achieves the benefits of such an approach without the associated disadvantages.

In various embodiments, a transconductance circuit of the invention can have more than two current sources connected in parallel, whose objective may be to further linearize the transconductance, or to improve the tolerance to mismatch over a wider range possible than two current sources.

Also, the outputs may be connected together via a cascode circuit, to improve the speed, noise rejection, or accuracy of the output current.

The invention is not limited to the embodiments described but may be varied in construction and detail.

For example, in another embodiment of the invention the NMOS devices are replaced with PMOS devices, so the output transconductance current sources are now transconductance current sinks.

In another embodiment of this invention the NMOS or PMOS MOSFET devices are replaced with NPN or PNP bipolar transistors creating bipolar based output transconductance current sources or current sinks.

Also, the voltage change circuit may be implemented alternatively than by a source follower and a current source, for example a combination of a resistor with a current source/sink, with the use of an amplifier to buffer the input from any current dissipation.

The invention claimed is:

1. A transconductance circuit comprising:
an input terminal and an output terminal;
a first current source having a gate connected to said input terminal; and
a second current source, in parallel with said first current source, and having a higher transconductance and a wider dynamic range than the first current source, and
wherein the current sources are configured so that at a low input voltage only the first current source is on, and
wherein:
the transconductance circuit comprises a voltage drop circuit providing a lower bias voltage for the second current source than for the first current source,
the voltage drop circuit comprises a source follower and a current source for the source follower, in which the input terminal is linked with the gate of the source follower and the first current source, and
the source follower and the current sources are configured so that a gate-source voltage drop across the source follower ensures that the second current source is off until a point during which the input voltage increases at which the second current source is switched on.

2. The transconductance circuit as claimed in claim 1, wherein each of the current sources is a NMOS or a PMOS MOSFET device or a PNP or an NPN transistor.

3. The transconductance circuit as claimed in claim 1, comprising greater than two current sources with different transconductances which are connected in parallel.

4. The transconductance circuit as claimed in claim 1, where an output terminal is linked either directly or via cascodes to the outputs of the first and second current sources.

5. An optical receiver comprising a photodiode and the transconductance circuit of claim 1 linked to said photodiode.

* * * * *